United States Patent [19]
Nakamura et al.

[11] Patent Number: 5,734,914
[45] Date of Patent: Mar. 31, 1998

[54] COMPUTER SYSTEM CAPABLE OF SHIFTING VOLTAGE LEVEL OF DATA SIGNAL BETWEEN PROCESSOR AND SYSTEM MEMORY

[75] Inventors: Nobutaka Nakamura, Hidaka; Koichi Senuma, Tokyo, both of Japan

[73] Assignee: Kabushiki Kaisha Toshiba, Kawasaki, Japan

[21] Appl. No.: 609,615

[22] Filed: Mar. 1, 1996

[30] Foreign Application Priority Data

Mar. 3, 1995 [JP] Japan .................... 7-044502

[51] Int. Cl.$^6$ .................... G06F 1/26
[52] U.S. Cl. .................... 395/750.01
[58] Field of Search .................... 395/750, 750.01, 395/750.08; 327/519

[56] References Cited

U.S. PATENT DOCUMENTS

| | | | |
|---|---|---|---|
| 5,031,149 | 7/1991 | Matsumoto et al. | 365/189.11 |
| 5,315,545 | 5/1994 | Guo et al. | 365/156 |
| 5,352,942 | 10/1994 | Tanaka et al. | 307/475 |
| 5,404,543 | 4/1995 | Faucher et al. | 395/750 |
| 5,467,313 | 11/1995 | Jung et al. | 365/189.11 |
| 5,469,082 | 11/1995 | Bullinger et al. | 326/81 |
| 5,508,653 | 4/1996 | Chu et al. | 327/519 |
| 5,612,892 | 3/1997 | Almulla | 364/489 |

*Primary Examiner*—Ayaz R. Sheikh
*Attorney, Agent, or Firm*—Oblon, Spivak, McClelland, Maier & Neustadt, P.C.

[57] ABSTRACT

There is provided a computer system including a system memory operable with a first voltage level, a processor operable with a second voltage level different from the first voltage level, and capable of accessing the system memory to perform burst read, a data bus connected to the processor, and a level shifter connected between the system memory and the data bus for shifting the voltage level of a data signal supplied from the system memory and transferring the level-shifted data signal to the data bus, the level shifter including a latch circuit for sequentially latching, at predetermined interval, a plurality of n-bit data which constitute the level-shifted data signal, to thereby minimize the interval between each adjacent pair of the n-bit data.

10 Claims, 4 Drawing Sheets

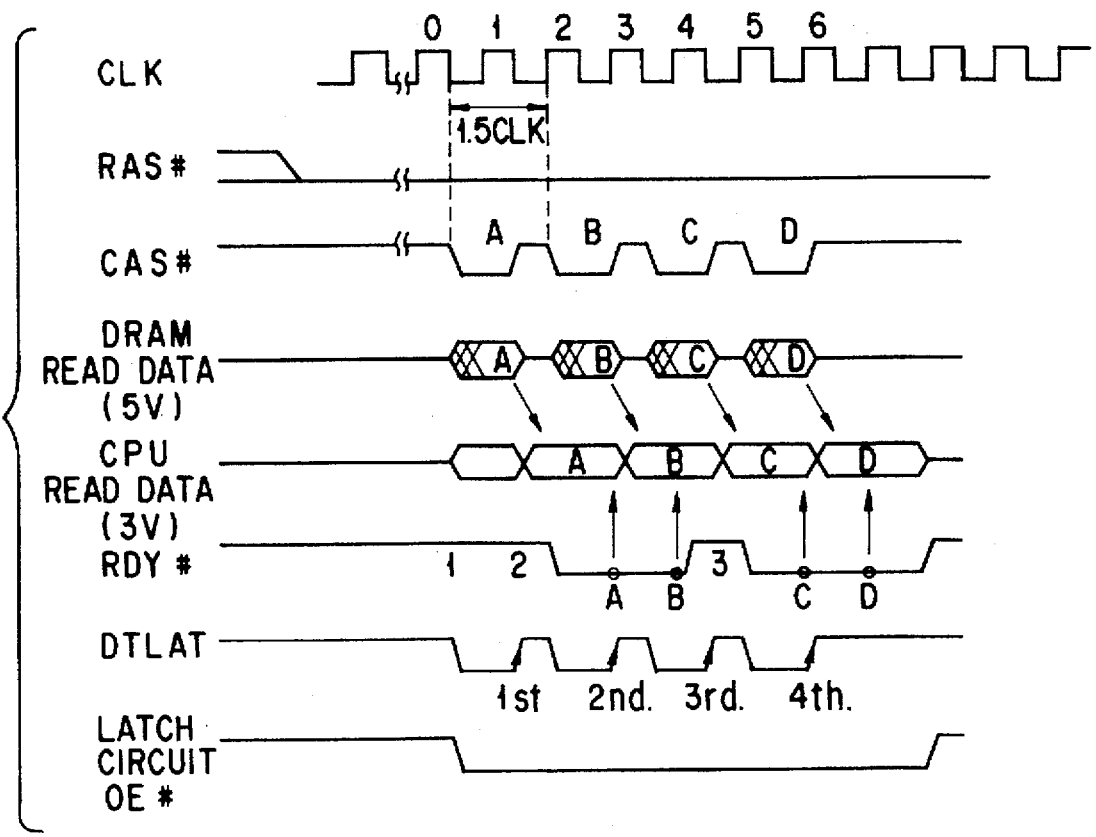
F I G. 4
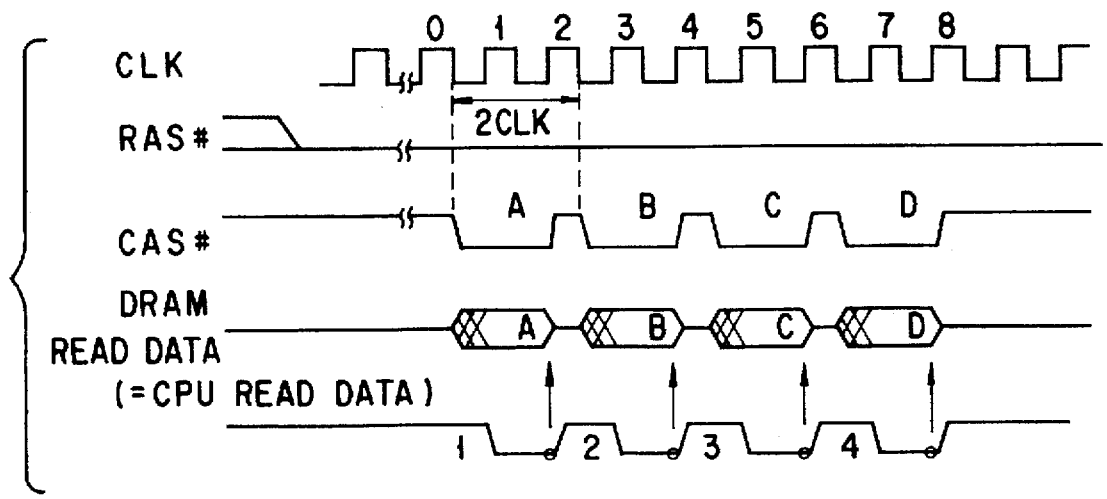
F I G. 5

COMPUTER SYSTEM CAPABLE OF SHIFTING VOLTAGE LEVEL OF DATA SIGNAL BETWEEN PROCESSOR AND SYSTEM MEMORY

BACKGROUND OF THE INVENTION

1. Field of the Invention

The present invention relates to a computer system equipped with a microprocessor operable with low voltage.

2. Description of the Related Art

Recently, note-book type or lap-top type portable personal computers have been developed which can be carried with ease and be operated by a battery. In these personal computers, high-speed operation, power saving and low-cost production are now being requested. To meet the requests, a microprocessor of high performance, such as microprocessor 80486 produced by U.S. Intel Corporation and including a large-scale cache operable with 3.3 V, has recently been used as a CPU (Central Processing Unit).

The microprocessor of high performance which is operated by a low power voltage and contains a cache can reduce the power consumption of the CPU and the number of operations of access to the system memory, thereby increasing the operational speed of the personal computer and reducing the power consumption of the same.

Furthermore, dynamic RAMs (Random Access Memories) used as system memories have recently employed a technique for rendering them operable with low voltage, with the result that those operable with 3.3 V are now available in the market.

However, the 3.3 V-operable dynamic RAMs are much more expensive than general dynamic RAMs operable with 5 V. Moreover, recent personal computers require a very high memory capacity since they employ a multi-task operation system, etc. Therefore, if the system memory is constituted by a dynamic RAM operable with 3.3 V, a significantly high cost is required to produce the computer, although the dynamic RAM can reduce the power consumption of the same.

On the other hand, although the 5 V-operable dynamic RAM is cheap, it cannot be used together with a 3.3 V-operable microprocessor.

In other words, where the CPU and the system memory operate with different power voltages, the voltage levels of data signals input to or output from the CPU and the system memory differ from each other. If the 5 V-operable dynamic RAM is directly connected to the data bus of the 3.3 V-operable CPU, it is possible that data will not be read or written correctly, or that the CPU will be malfunctioned by a data signal of 5 V supplied from the system memory.

As described above, if in the conventional case, the system memory is constituted by the 3.3 V-operable dynamic RAM, the cost required for the computer may become significantly high. On the other hand, if the 5 V-operable dynamic RAM is used, a CPU operable with low voltage cannot be used.

SUMMARY OF THE INVENTION

It is an object of the present invention to provide a computer system which is operable at high speed with low power and can be produced at low cost.

It is another object of the present invention to provide a computer system capable of employing a processor and a system memory which are operable with different power voltages.

It is a further object of the present invention to provide a computer system which has a processor capable of accessing at high speed a system memory employed therein to read data therefrom.

According to a first aspect of the present invention, there is provided a computer system comprising a system memory operable with a first voltage level; a processor operable with a second voltage level different from the first voltage level, and capable of accessing the system memory to perform burst read; a data bus connected to the processor; and a level shifter connected between the system memory and the data bus for shifting the voltage level of a data signal supplied from the system memory and transferring the level-shifted data signal to the data bus, the level shifter including a latch circuit for sequentially latching, at predetermined interval, a plurality of n-bit data which constitute the level-shifted data signal, to thereby minimize the interval between each adjacent pair of the n-bit data.

The first voltage level applied to the system memory may be higher than the second voltage level applied to the processor. For example, the first voltage level applied to the system memory may be 5 V, and the second voltage level applied to the processor may be 3.3 V. Further, the latch circuit may have means for latching each of the n-bit data in a cycle 1.5 times the cycle of a clock signal in the processor.

Moreover, the computer system may further comprise a memory controller connected to the processor and the system memory for controlling the system memory in accordance with the access cycle of the processor at the time of performing burst read, so as to feed n-bit data constituting the data signal to the level shifter. In this case, the system memory may have a dynamic random access memory (DRAM). The memory controller may have means for generating a latch signal to enable the latch circuit to latch the n-bit data. Furthermore, the memory controller may have means for generating a column address strobe (CAS) signal to the DRAM in a cycle 1.5 times the cycle of a clock signal in the processor. In this case, the latch signal generating means may have means for generating the latch signal in synchronism with the CAS signal generated by the CAS signal generating means.

According to a second aspect of the present invention, there is provided a computer system comprising a system memory operable with a first voltage level; a processor operable with a second voltage level different from the first voltage level, and capable of accessing the system memory to perform burst read; a data bus connected to the processor; a level shifter connected between the system memory and the data bus for shifting the voltage level of a data signal supplied from the system memory and transferring the level-shifted data signal to the data bus, the level shifter including a latch circuit for sequentially latching, at predetermined interval, a plurality of n-bit data which constitute the level-shifted data signal, to thereby minimize the interval between each adjacent pair of the n-bit data; and a memory controller interposed between the processor and the system memory for controlling the system memory in accordance with the access cycle of the processor at the time of performing burst read, so as to feed n-bit data constituting the data signal to the level shifter, the memory controller including means for generating a column address strobe (CAS) signal to the DRAM, the CAS signal being used by the latch circuit to latch the n-bit data.

In the computer system, the first voltage level applied to the system memory may be 5 V, and the second voltage level applied to the processor be 3.3 V. In addition, the CAS signal generating means may generate the CAS signal in a cycle 1.5 times the cycle of a clock signal in the processor.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiment of the present invention and, together with the general description given above and the detailed description of the preferred embodiment given below, serve to explain the principles of the present invention in which:

FIG. 4 is a timing chart useful in explaining a transfer operation performed at the time of burst read by the reading transfer circuit shown in FIG. 3 when the transfer circuit has a read buffer; and FIG. 5 is a timing chart useful in explaining a transfer operation performed at the time of burst read by the reading transfer circuit shown in FIG. 3 when the transfer circuit has no read buffer.

DETAILED DESCRIPTION OF THE PREFERRED EMBODIMENT

The embodiment of the present invention will be explained with reference to the accompanying drawings.

Figure 1:
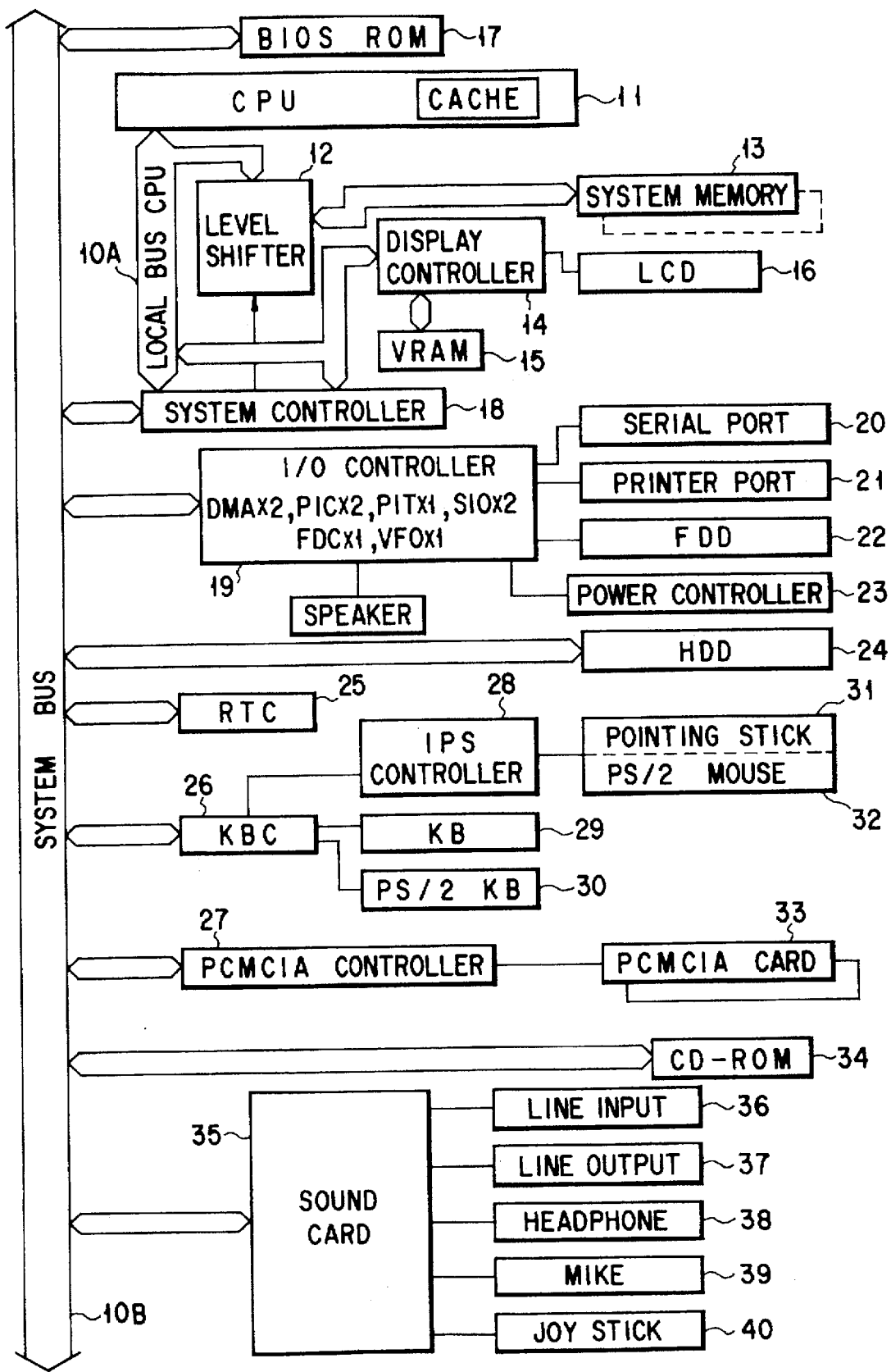
FIG. 1 is a block diagram showing a computer system (portable personal computer) according to the embodiment of the present invention.

FIG. 1 is a block diagram showing a computer system (portable personal computer) according to the embodiment of the present invention.

This personal computer is of the lap-top type or of the note-book type. As is shown in FIG. 1, the computer comprises a CPU local bus (processor bus) 10A, a system bus 10B with an ISA (Industry Standard Architecture) specification, a CPU 11, a level shifter (a gate array for level shifting) 12, a system memory 13, a display controller 14, a video memory (VRAM) 15, and a flat panel display 16.

The CPU 11 controls the overall system, and executes programs stored in the system memory 13. A microprocessor operable with 3V or 5V, for example, microprocessor SL Enhanced Intel 486 produced by U.S. Intel Corporation, is used as the CPU 11. The CPU 11 is supplied with a power voltage of 3.3 V from a power controller 23 which will be explained later. The CPU 11 contains a cache memory having a single-line data size of (32 bits×4). The local bus 10A of the CPU 11 includes a data bus of a 32-bit width, an address bus of a 32-bit width, various status signal lines, etc.

The system memory 13 stores an operating system, application programs to be executed, user data created by the application programs, etc. The system memory 13 is constituted by a dynamic RAM operable with 5 V.

The level shifter (level shifting gate array) 12 is connected between the 32-bit data bus included in the CPU local bus 10A and the system memory 13. The level shifter 12 shifts the voltage level of a data signal from 3.3 V to 5 V, and transfers the level-shifted signal to the system memory 13. Specifically, the voltage level shifting of the data signal is executed by a transfer circuit (which will be explained later) included in the level shifter 12. To enable high-speed data transfer with the CPU bus cycle kept out of synchronism with the read access cycle of the system memory 13, the transfer circuit for reading included in the level shifter 12 has a data latch function for latching read data from the system memory 13. The present invention is characterized by the level shifter 12 and its data latch function, whose specific structure will be explained later.

The display controller 14 controls the flat panel display 16 which consists of an STN (Supertwisted Nematic) monochrome liquid crystal display, an STN color liquid crystal display or a TFT color liquid crystal display. The display controller 14 receives display data from the CPU 11 through the CPU local bus 10A, and writes the data in the video memory (VRAM) 15.

The system bus 10B is connected to a BIOS ROM (Basic Input/Output System Read Only Memory) 17, a system controller 18 and an I/O controller 19.

The BIOS ROM 17 is provided for storing a system BIOS and consists of a programmable flash memory. The system BIOS includes an IRT (initialize reliability test) routine executed at the time of power-on, a device driver for controlling various I/O devices, a system management program, a set-up program, etc.

The system controller 18 comprises a bridge device which connects the CPU local bus 10A to the system bus 10B, and a memory control logic for controlling various memories included in the system, etc.

The I/O controller 19 controls the I/O devices, etc. connected to a serial port 20, a printer/external FDD, etc. connected to a parallel port (printer port) 21, and a 3.5-inch FDD 22 installed in the system.

Moreover, the I/O controller 19 includes two DMA (Direct Memory Access) controllers for directly controlling memory access, two PICs (Programmable Interrupt Controllers), a PIT (Programmable Interval Timer), two SIOs (Serial Input/Output Controllers), and a FDC (Floppy Disk Controller).

The I/O controller 19 further includes I/O registers used to connect a PSC (Power Supply Controller) 23 to the CPU 11, I/O registers for environmental setting of the parallel port 21, etc.

The system bus 10B is connected to a built-in HDD (Hard Disk Drive) 24, a RTC (Real Time Clock) 25, a KBC (Keyboard Controller) 26, PCMCIA controller 27 of a PCMCIA (Personal Computer Memory Card International Association) specification, a CD-ROM (Compact Disk Read Only Memory) 34, and a sound card 35.

The RTC 25 is a clock module driven by an operating battery dedicated thereto, and has a static RAM of a CMOS (Complementary Metal Oxide Semiconductor) structure, hereinafter referred to as "CMOS memory", which is supplied with power from the battery at all times. The CMOS memory is used to store environmental setting data indicative of a system operation environment.

The KBC 26 controls a keyboard 29 incorporated in the computer main body. The KBC 26 receives a signal corresponding to a pushed key by scanning the key matrix of the built-in key board 29, and converts the signal to a predetermined key code (scan code). Further, the KBC 26 has a function for controlling an external keyboard 30 optionally connected to the system, and a function for controlling a pointing stick 31 and a mouse 32 using an IPS controller 28 as a dedicated processor. The pointing stick 31 is formed integral with a keyboard unit for the built-in keyboard 29.

The PCMCIA controller 27 controls the access of a PC card 33 of a JEIDA (Japan Electronic Publishers Association)/PCMCIA specification.

The sound card 35 has a PCM (Pulse Code Modulation) sound source, and a processing circuit for converting a voice signal to a digital signal. The sound card 35 is connected to a line input terminal 36, a line output terminal 37, a headphone terminal 38, a mike terminal 39, and a joy stick terminal 40.

Figure 2:
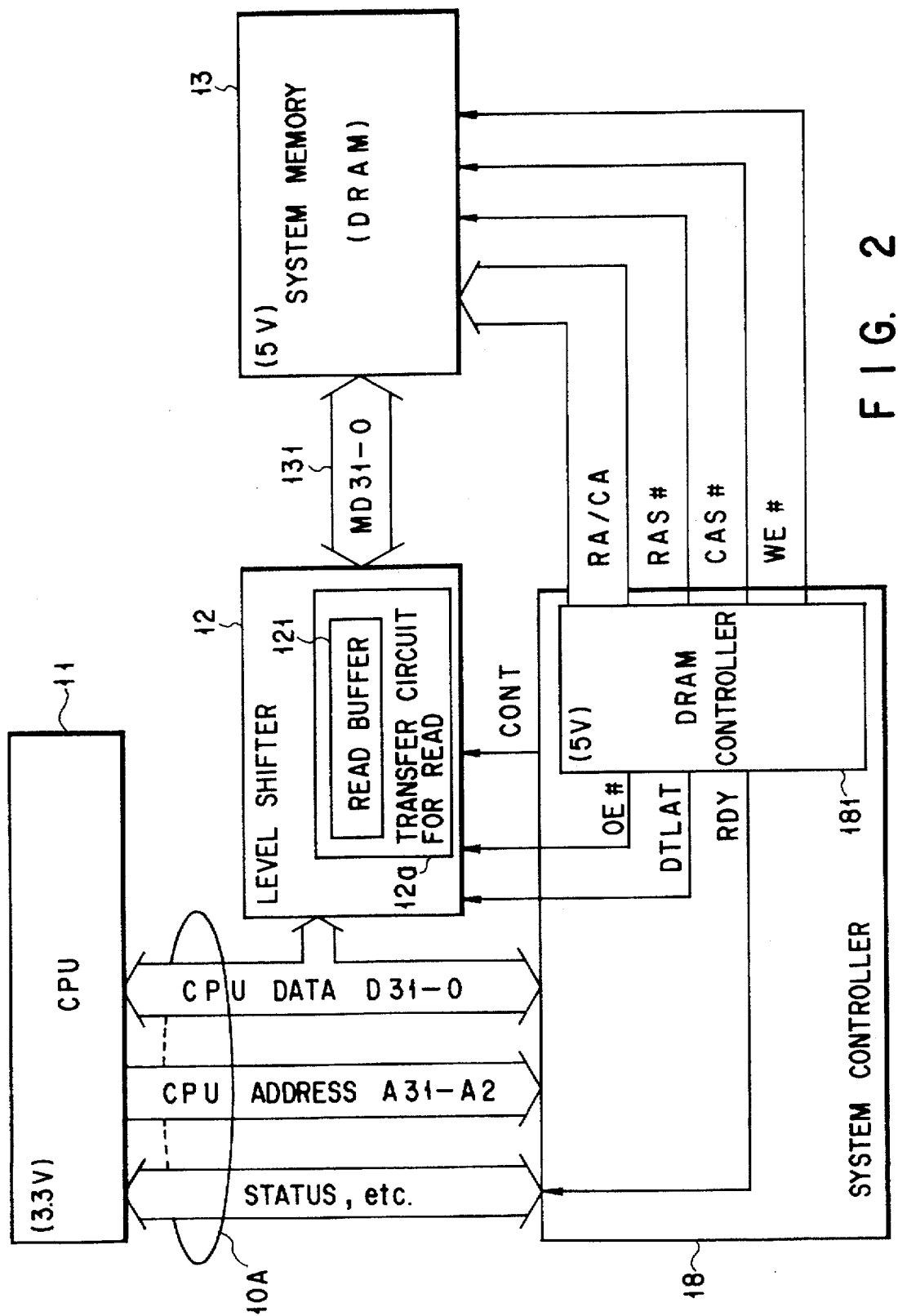
FIG. 2 is a block diagram useful in explaining a level shifter and its peripheral hardware employed in the system shown in FIG. 1.

Referring then to FIG. 2, detailed explanations will be given of the level shifter 12 and its peripheral hardware.

The level shifter 12 is supplied with two power voltages of 3.3 V and 5 V from the power controller 23. The level shifter 12 has a transfer circuit 12a for reading to convert input data of 5 V to output data of 3.3 V, and a transfer circuit (not shown) for writing to convert input data of 3.3 V to output data of 5 V.

To write data in the system memory 13, the following processing is performed during the memory write cycle:

Write data of 32 bits is supplied from the CPU 11 to the level shifter 12 via data buses (D31-0) included in the CPU local bus 10A. In this case, the write data input to the level shifter 12 has a voltage level of 3.3 V. After the level of the write data is shifted to 5 V by means of the transfer circuit for writing of the level shifter 12, the data is transferred to the data port of the system memory 13 via memory data buses (MD31-0) 131.

On the other hand, to read data from the system memory 13, the following processing is performed during the memory read cycle:

Read data of 32 bits read from the system memory 13 is supplied to the level shifter 12 via the memory data buses (MD31-0) 131. In this case, the read data input to the level shifter 12 has a voltage level of 5 V. After the level of the write data is shifted to 3.3 V by means of the transfer circuit for reading of the level shifter 12, the data is transferred to the CPU 11 via the data buses (D31-0) included in the CPU local bus 10A.

The above-described operations of the level shifter 12 are controlled by a control signal CONT, an output enable signal OE#, a latch signal DTLAT, etc. supplied from the system controller 18. Moreover, during the transfer cycle for reading, the 32-bit read data read from the system memory 13 is output to the data buses (D31-0) in the CPU local bus 10A via a read buffer 121 included in the transfer circuit 12a for reading in the level shifter 12. The read buffer 121 is provided to perform high-speed data transfer during reading, with the cycle of the memory data buses (MD31-0) 131 kept out of synchronism with the cycle of the data buses (D31-0) in the CPU local bus 10A. The read buffer 121 will be explained later in more detail.

Like the level shifter 12, the system controller 18 is supplied with two power voltages of 3.3 V and 5 V from the power controller 23. The system controller 18 contains a CPU bus interface (not shown), which is connected to the CPU local bus 10A and operable with 3.3 V. Further, the system controller 18 has a DRAM (Dynamic Random Access Memory) controller 181.

The DRAM controller 181 controls the DRAM constituting the system memory 13 in accordance with the bus cycle assumed when the CPU 11 accesses the memory. The DRAM controller 181 operates when 5 V is applied thereto. The DRAM controller 181 divides each CPU address (A31-A2) into a row address RA and a column address CA, and supplies them to the system memory 13 in a time-series manner. Further, the DRAM controller 181 generates a row address strobe signal RAS#, a column address strobe signal CAS#, a write enable signal WE#, etc., and supplies them to the DRAM.

The system controller 18 generates a latch signal DTLAT, an output enable signal OE#, etc., and supplies them to the transfer circuit 12a for reading in the level shifter 12. The system controller 18 further generates a burst ready signal RDY#, etc., and supplies them to the CPU 11.

Figure 3:
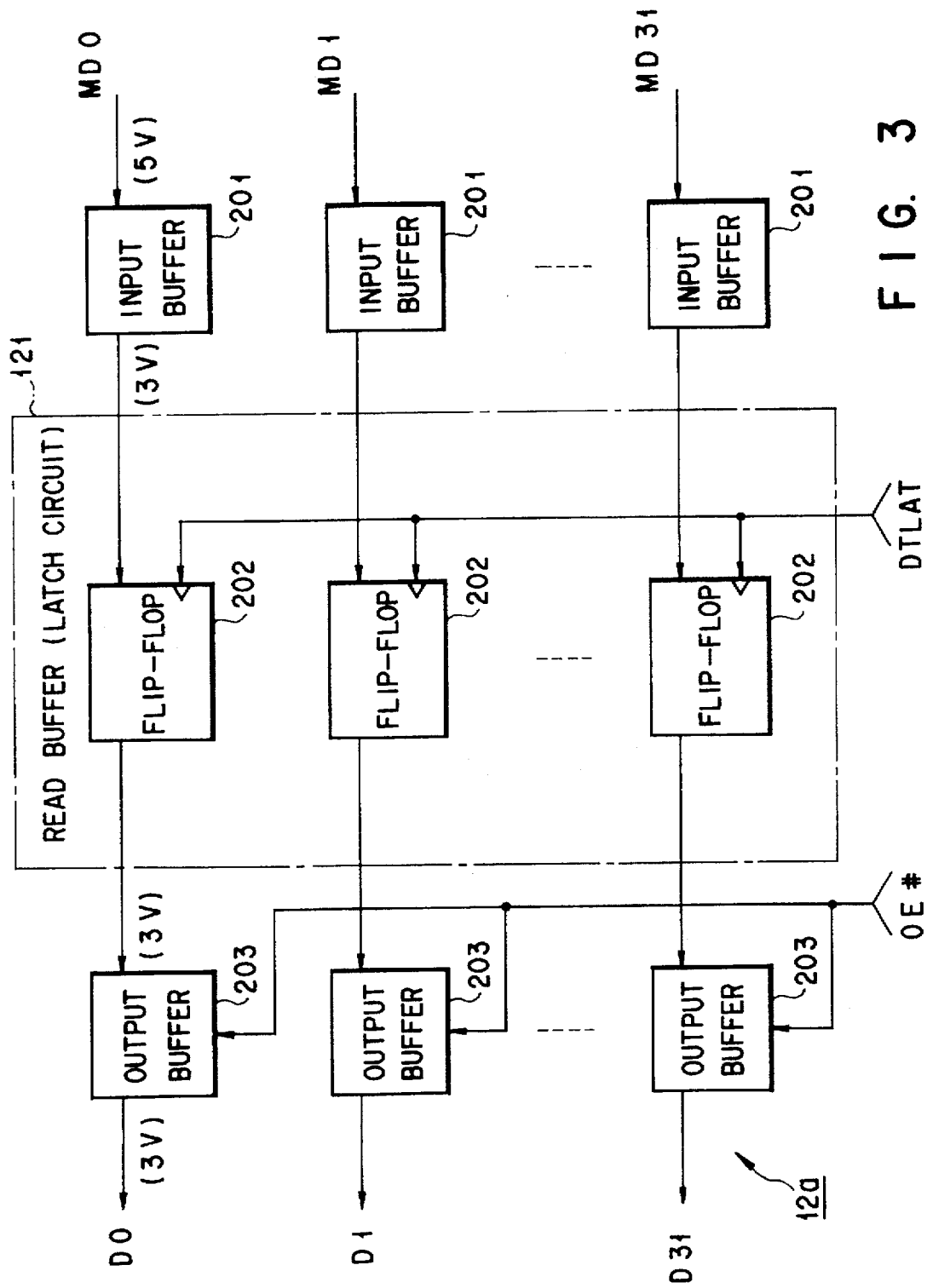
FIG. 3 is a circuit diagram showing a transfer circuit for reading in the level shifter employed in the system shown in FIG. 1.

FIG. 3 is a circuit diagram, showing the structure of the transfer circuit for reading in the level shifter incorporated in the FIG. 1 system.

As is shown in FIG. 3, the transfer circuit 12a comprises 32 input buffers 201, 32 flip-flops 202, and 32 output buffers 203. Each of the 32 input buffers 201 shifts, from 5 V to 3.3 V, the voltage level of corresponding bit data of the 32-bit read data (MD31-0) read from the system memory 13, and supplies the bit data to a corresponding one of the flip-flops 202.

The 32 flip-flops 202 constitute a single read buffer (a latch circuit of a 32-bit width) 121. Each of the flip-flops 202 latches input data in synchronism with the leading edge of the latch signal DTLAT supplied from the system controller 18, and outputs it to a corresponding one of the output buffers 203. The latch signal DTLAT is generated in synchronism with the generation of the column address strobe signal CAS#.

The 32 output buffers 203 output read data latched by the 32 flip-flops 202, to the data buses (D31-0) in the CPU local bus 10A. The 32 output buffers 203 output the read data in response to the output enable signal OE# for the latch circuit supplied from the system controller 18.

Both 5 V and 3.3 V are applied to the input buffer 201, while only 3.3 V is applied to the flip-flops 202 and the output buffers 203.

Referring then to the timing chart of FIG. 4, an explanation will be given of the transfer operation performed, during burst reading, by the transfer circuit 12a for reading equipped with the read buffer 121.

As aforementioned, the CPU 11 contains a cache of a line size of (32 bits×4), so that the memory read assumed when a cache error has occurred is executed in the burst read mode for reading data of four double words (32 bits×4) in order to fill a cache line with the data.

The DRAM controller 181 is responsive to the bus cycle of burst read executed by the CPU 11, for starting read access to the system memory 13 in the page mode.

In the page mode, the row address RA is output first, and then four column addresses CA are sequentially output in the order from the lowest one. In this case, the row address RA and the row address strobe signal RAS# are simultaneously output, while the column address CA and the column addresses strobe signal CAS# are simultaneously output. The interval of the column addresses CA, i.e. the cycle of the signal CAS# is preferably 1.5 times the cycle of a clock signal CLK in the CPU (i.e. 1.5 clocks). Accordingly, the latch signal DTLAT of a cycle of 1.5 clocks is supplied to the read buffer 121 in synchronism with the cycle of the signal CAS#.

Each time the column address CA is input to the system memory 13, address data determined by the column address CA and the row address RA input previous to the column address is read from the system memory 13. Thus, four data A, B, C and D with serial address numbers are sequentially read from the system memory 13 in accordance with input of four sequential column addresses CA.

After the voltage level of the 32-bit data A is shifted from 5 V to 3.3 V, the data is latched in synchronism with the leading edge of a first latch signal DTLAT. The latch data is output as CPU data to the data buses (D31-0) in the CPU local bus 10A. Similarly, the data B is latched in synchronism with the leading edge of a second latch signal DTLAT. As a result, the CPU data is shifted from the data A to the data B. The data C and D are latched in synchronism with the leading edges of third and fourth latch signals DTLAT, respectively. Since the cycle of the latch signal DTLAT is 1.5 clocks, the data A–D are latched at intervals of 1.5 clocks.

Therefore, as is shown in FIG. 4, the data output to the data buses (D31-0) in the CPU local bus 10A changes in the order of A, B, C and D at intervals of 1.5 clocks.

The CPU 11 samples a burst ready signal RDY# generated from the system controller 18, each time the clock signal CLK rises. If the burst ready signal RDY# is inactive, the CPU 11 waits by one clock, while if the burst signal RDY# is active, the CPU 11 fetches the data on the data bus.

In this embodiment, the data A is output when the third pulse of the clock signal CLK rises, and the data B is output when the fourth pulse rises. Therefore, if the CPU 11 is controlled to wait by two clocks before reading the data A and B as shown in FIG. 4, it can, after that, read the data A and B sequentially without waiting.

Moreover, the data C is output when the sixth pulse of the clock signal CLK rises, and the data D is output when the seventh pulse rises. Therefore, if the CPU 11 is controlled to wait by one clock before reading the data C and D as shown in FIG. 4, it can, after that, read the data C and D sequentially without waiting. Thus, the burst read of four double words can be achieved by waiting by three clocks, only.

On the other hand, where there is no read buffer 121 as in the conventional case, the cycle of the column address strobe signal CAS# cannot be set to 1.5 clocks. Therefore, as is shown in FIG. 5, it is necessary to set the cycle of the signal CAS# to 2 clocks. If the column address strobe signal CAS# is generated in the cycle of 1.5 clocks, the period of time for which data is output from the system memory 13 is only one clock. It is actually difficult for the CPU 11 to fetch data of one clock in synchronism with the leading edge of the clock signal CLK. If this is done, data may well be damaged. Thus, without the read buffer 121, the cycle of the signal CAS# cannot be set to 1.5 clocks.

In addition, where no read buffer 121 is employed, output of data from the system memory 13 stops while the column address strobe signal CAS# is being set up (the signal is at "H" level). Accordingly, it is necessary for the CPU 11 to wait by at least four clocks to perform burst read of four double words as shown in FIG. 5. This means that data cannot be transferred at high speed.

As explained above, in the embodiment, to enable the 3.3 V-operable CPU 11 to access the 5 V-operable system memory, the level shifter 12 is interposed between the data bus of the CPU 11 and the system memory 13 for shifting the voltage level of a data signal to enable the signal to be bidirectionally transferred therebetween. Furthermore, the read buffer (latch circuit) 121 is incorporated in the level shifter 12 to enable high-speed data transfer with the read cycle of the system memory 13 kept out of synchronism with the bus cycle of the CPU 11. Accordingly, the period of waiting which is necessary at the time of burst read can be shortened.

The high-speed access technique for burst read, using the read buffer 121, is also applicable to a system wherein no level shifting of a data signal is necessary. In this case, too, burst read for filling the cache line can be performed at high speed.

As explained above, even if the processor and the system memory are operated with different power voltages, they can be used in a computer by inserting the level shifter between the data bus of the processor and the system memory. Moreover, the access speed of the processor at the time of reading data from the system memory can be increased by imparting a data latch function to the level shifter. In addition, the present invention can achieve a high speed operation of the system, and reduce the power consumption of the same. Also, the present invention makes it possible to produce the system at low cost.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, although in the embodiment, high speed access to the system memory to read data therefrom was explained, high speed access can be realized to write data in the system memory in the same manner as described in the embodiment.

What is claimed is:

1. A computer system comprising:

a system memory operable with a first voltage level;

a processor operable with a second voltage level different from the first voltage level, and capable of accessing the system memory to perform a burst read;

an n-bit data bus connected to the processor;

a level shifter connected between the system memory and the data bus for shifting the voltage level of a data signal supplied from the system memory and transferring the level-shifted data signal to the data bus, the level shifter including a latch circuit for sequentially latching, at predetermined intervals, a plurality of n-bit data which constitute the level-shifted data signal; and a memory controller interposed between the processor and the system memory for controlling the system memory in accordance an the access cycle of the processor at a time of performing the burst read, so as to feed n-bit data constituting the data signal to the level shifter, the memory controller including latch signal generating means for generating a latch signal to enable the latch circuit to latch the n-bit data, and column address strobe (CAS) signal generating means for generating a CAS signal to the system memory in a cycle k (where k<2) times a cycle of a clock signal in the processor, the latch signal generating means including means for generating the latch signal in synchronism with the CAS signal generated by the CAS signal generating means.

2. The system according to claim 1, wherein the first voltage level applied to the system memory is higher than the second voltage level applied to the processor.

3. The system according to claim 2, wherein the first voltage level applied to the system memory is 5 V.

4. The system according to claim 3, wherein the second voltage level applied to the processor is 3.3 V.

5. The system according to claim 1, wherein the latch circuit has means for latching each of the n-bit data in a cycle 1.5 times the cycle of a clock signal in the processor.

6. The system according to claim 1, wherein the system memory has a dynamic random access memory (DRAM).

7. A computer system comprising:

a system memory operable with a first voltage level;

a processor operable with a second voltage level different from the first voltage level, and capable of accessing the system memory to perform burst read;

a n-bit data bus connected to the processor;

a level shifter connected between the system memory and the data bus for shifting the voltage level of a data signal supplied from the system memory and transferring the level-shifted data signal to the data bus, the level shifter including a latch circuit for sequentially latching, at predetermined intervals, a plurality of n-bit data which constitute the level-shifted data signal; and a memory controller connected to the processor and the system memory for controlling the system memory in accordance with the access cycle of the processor at the time of performing a burst read, so as to feed n-bit data constituting the data signal to the level shifter in the order from one with a smallest address number, the memory controller including means for generating a column address strobe (CAS) signal to the system memory, the CAS signal being used by the latch circuit to latch the n-bit data.

8. The system according to claim 7, wherein the first voltage level applied to the system memory is 5 V.

9. The system according to claim 8, wherein the second voltage level applied to the processor is 3.3 V.

10. The system according to claim 7, wherein the CAS signal generating means generates the CAS signal in a cycle 1.5 times the cycle of a clock signal in the processor.

* * * * *